United States Patent [19]
Subbanna

[11] Patent Number: 5,338,698
[45] Date of Patent: Aug. 16, 1994

[54] METHOD OF FABRICATING AN ULTRA-SHORT CHANNEL FIELD EFFECT TRANSISTOR

[75] Inventor: Seshadri Subbanna, Hopewell Junction, N.Y.

[73] Assignee: International Business Machines Corporation, Armonk, N.Y.

[21] Appl. No.: 995,416

[22] Filed: Dec. 18, 1992

[51] Int. Cl.⁵ .......................................... H01L 21/265
[52] U.S. Cl. .................................. 437/40; 437/200; 437/203; 437/913
[58] Field of Search .................... 437/34, 40, 41, 203, 437/200, 913, 56; 148/DIG. 50

[56] References Cited

U.S. PATENT DOCUMENTS

| | | | |
|---|---|---|---|
| 4,503,598 | 3/1985 | Vora et al. | 437/913 |
| 4,539,742 | 9/1985 | Kanzaki et al. | 437/203 |
| 4,826,781 | 5/1989 | Asahina et al. | 437/48 |
| 4,879,254 | 11/1989 | Tsuzuki et al. | 437/203 |
| 4,891,326 | 1/1990 | Koyanagi | 437/44 |
| 4,963,502 | 10/1990 | Teng et al. | 437/56 |
| 5,079,182 | 1/1992 | Ilderem et al. | 437/44 |

FOREIGN PATENT DOCUMENTS

| | | | |
|---|---|---|---|
| 58-141570 | 8/1983 | Japan | 437/29 |
| 63-289963 | 11/1988 | Japan | 437/229 |
| 1-187870 | 7/1989 | Japan | 437/913 |

*Primary Examiner*—Tom Thomas
*Assistant Examiner*—Michael Trinh
*Attorney, Agent, or Firm*—Whitham, Curtis & Whitham

[57] ABSTRACT

An ultra-short channel field effect transistor provides a combination of a shallow junction for injection of carriers into a conduction channel and a Schottky barrier below the shallow junction with a lowered barrier height to reduce the depletion region and punch-through effects. A preferred method of fabricating this structure includes both etching and metal deposition selectively on only semiconductor material, allowing use of only a single patterning step with registration tolerances comparable to channel length while allowing extremely high integration density.

8 Claims, 3 Drawing Sheets

METHOD OF FABRICATING AN ULTRA-SHORT CHANNEL FIELD EFFECT TRANSISTOR

BACKGROUND OF THE INVENTION

1. Field of the Invention

The present invention generally relates to field effect transistor structures and, more particularly, to ultra-short channel MOSFET structures.

2. Description of the Prior Art

Transistor designs can be generally grouped into two classes: bipolar transistors and field effect transistors. Bipolar transistors have been developed to very high performance levels and extremely small size in terms of substrate area occupied since the junctions thereof can be formed in sequence in a direction perpendicular to the substrate. However, the basic principles underlying the bipolar transistor require a base or input current when the transistor is in the "on" or conductive state. Also, because conductance occurs across semiconductor junctions, development of bias voltages is required for proper operation.

In contrast, conduction in field effect transistors (FETs) occurs through a channel which need not necessarily contain a junction although junctions have been added to some FET designs to improve performance. The width of the channel and, hence, the resistance of the channel is controlled by a gate which is insulated from the conduction path. Therefore, no continuous current is required for control of the FET but only a small current sufficient to charge and discharge the capacitance of the gate when the conduction state is changed.

Field effect transistors are, therefore, particularly advantageous for logic circuits. The fact that no current is required to maintain conduction increases "fan out" the number of devices that can be reliably driven by a preceding or input device in the overall circuit. Also, since input current is required only during the change of state of the transistor, power consumption and the requirements for heat dissipation are generally low and mostly dependent on the maximum required switching rate and current and resistance in the conduction channel. Further, when logic circuits are developed using field effect transistors, heat dissipation due to the small resistance of the channel is limited by the relatively small currents required when fan out (e,g, the number of devices driven) is suitably limited.

However, since field effect transistors are highly suited to logic circuitry, incentives for miniaturization exist to an even greater extent for field effect transistors than for bipolar transistors. More specifically, the current required during change of conductance states is a function of the gate capacitance. Therefore the speed of response, power consumption (and heat dissipation) and the current requirements (and fan out) are dependent on gate capacitance which may be reduced with the size of the gate or the drain to source channel length. Also, in integrated logic circuits, speed is increased by short conductor length and it is, therefore, very desirable to form as many elements on the same chip as possible.

So-called complementary metal-oxide-semiconductor (CMOS) designs have become popular in logic circuit designs for numerous reasons due to their noise immunity, operability over wide voltage ranges and other properties even though a greater number of transistors is necessary on a chip for equivalent logic functions than with other FET technologies. An impurity well of opposite conductivity type is also required for one of the transistors of each complementary circuit. These additional structures occupy space on the chip and thus further contribute to the incentive for miniaturization of the transistors formed thereon.

Several limitations on miniaturization of field effect transistors have been encountered. Most importantly, perhaps, it is extremely difficult to form field effect transistors with the conduction path or channel other than parallel to the substrate. Therefore, the size of the transistor cannot generally be made smaller than the size of the gate or the conduction channel. Further, as the conduction channel is made small, several adverse effects on transistor performance occur.

Specifically, the series resistance of an FET is a function of both the cross-sectional area and length of the conduction channel. It is desirable to limit the depth to which the conduction channel extends in order to limit the voltage which is needed to control the FET as well as to limit leakage and punch-through effects. This depth is generally limited by the depth to which source and drain contacts extend into a body of semiconductor material such as a structure having shallow impurity implants of an opposite conductivity type to that of the conduction channel material. When such implants extend less than 1500 Angstroms into the conduction channel material, they are commonly referred to as a shallow junction. The use of shallow junctions causes the series resistance to increase. Series resistance must, however, be maintained at a low value in order not to degrade the extrinsic transconductance of FET. In general, the greater the extrinsic transconductance of the FET, the faster the circuit performance obtained. Low series resistance is often achieved by siliciding (i.e. forming a metal silicide at a metal-silicon interface) of the source and drain or selectively depositing metal such as tungsten on the source and drain areas. However, this is difficult to achieve consistently for shallow junctions. The silicidation consumes surface silicon and can give rise to increased leakage current. These increases in series resistance due to the reduction of cross-sectional area of the conduction channel cannot be fully compensated by decreases in the length of the conduction channel. While short conduction channel length is desirable both for miniaturization as well as low series resistance, when the conduction channel length is reduced below about 0.25 $\mu$m, threshold voltage (the voltage at which the drain current starts to increase quickly) is reduced due to charge sharing with the drain junction. Similarly, leakage and punch through effects are increased. The leakage or "off" state current is increased due to the reduced threshold voltage, resulting in increased standby current for the chip. When the threshold voltage is lowered by a large amount, the device is said to be "punched through. While the threshold reduction can be limited by reducing the depth of the conduction channel, reduction of depth of the channel degrades series resistance, as discussed above.

The performance of FETs is improved by operating at low temperatures where the increase in carrier (electron or hole) mobility causes transconductance to increase. However, in the prior art, FETs for low temperature applications has simply scaled threshold voltages and oxide thicknesses from "room temperature" designs. Therefore, it is seen that related and conflicting design concerns effectively limit the minimum size at which FETs can be formed without degradation of performance. To date, all efforts to reduce series resistance and short channel effects have required additional regions to be formed, such as Schottky barriers, so-called lightly doped drain structures and the like which increase the number of process steps and have a substantial potential for reducing manufacturing yield due to the stringent requirements for mask registration at extremely small feature sizes.

SUMMARY OF THE INVENTION

It is therefore an object of the present invention to provide an ultra-short channel FET structure in which both short channel effect and series resistance are reduced.

It is another object of the invention to provide a field effect transistor structure applicable to CMOS designs which is of improved performance and can be produced with fewer processes steps and less stringent registration tolerances.

It is a further object of the invention to provide a simplified, high-performance FET design which can readily be implemented in CMOS technology.

In order to accomplish these and other objects of the invention, a field effect transistor is provided including, in combination, a semiconductor substrate of a first conductivity type, a metal deposit extending below a surface of the semiconductor substrate by a first distance, and an impurity doped region of a second impurity type adjacent said metal deposit and extending below a gate of the field effect transistor by a second distance which is less than the first distance.

In accordance with another aspect of the invention, a method of fabricating a field effect transistor is provided including the steps of forming blanket layers of a gate oxide, a gate electrode material and an oxide over said layer of gate electrode material, over a layer of semiconductor material of a first conductivity type having shallow isolation trenches formed therein, patterning the blanket layers to remove all of the material of the blanket layers except at a generally centered location between a pair of the shallow isolation trenches, remaining portions of said blanket layers being laterally separated from edges of the shallow isolation trenches, implanting an impurity of a second conductivity type to a first depth between edges of the remaining portions of said blanket layers and the shallow trenches, forming sidewall spacers on the remaining portions of said blanket layers, removing material from a surface of the layer of semiconductor material to a second depth exceeding the first depth between said shallow trenches and said sidewalls, and depositing metal in volumes formed by said removing step.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
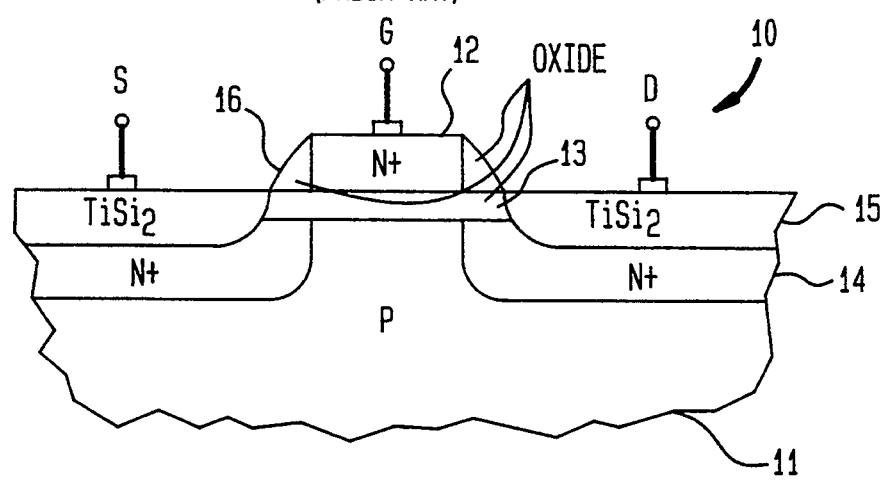
FIG. 1 is a cross-sectional view of a conventional FET structure.

Referring now to the drawings, and more particularly to FIG. 1, there is shown a conventional FET structure 10. In this case, an N-channel FET (N-FET) is shown but the conductivity types of impurities could be interchanged for a P-channel FET (P-FET) in FIG. 1 and all other FIGURES of this application. Therefore, the structure illustrated and a similar structure having conductivity types of impurities reversed are applicable, by extension, to CMOS circuits have at least one P-FET and at least one N-FET. The P-type substrate or layer 11 in which the conduction channel is formed could also be provided as a well, formed by implantation or other techniques. The N+ gate region 12 is separated from P-type substrate or layer 11 by an insulating gate oxide 13. Source and drain junctions 14 are formed at the boundaries of the channel under the gate oxide for carrying the current. These regions are overlaid with a metal silicide such as titanium silicide for reducing series resistance as discussed above as well as contact resistance. Note, however, that the junctions formed by the N+ regions 14 are not of the shallow junction type. Also, it is preferable in view of the well-known fabrication processes for devices of this type and also to improve device breakdown voltage to provide insulating sidewall oxide deposits 15. Conduction is achieved in this type of FET by the existence or generation of an inversion region below gate 12 and extending between the source and drain N+ regions 14 by application of a voltage to gate 12.

Figure 2:
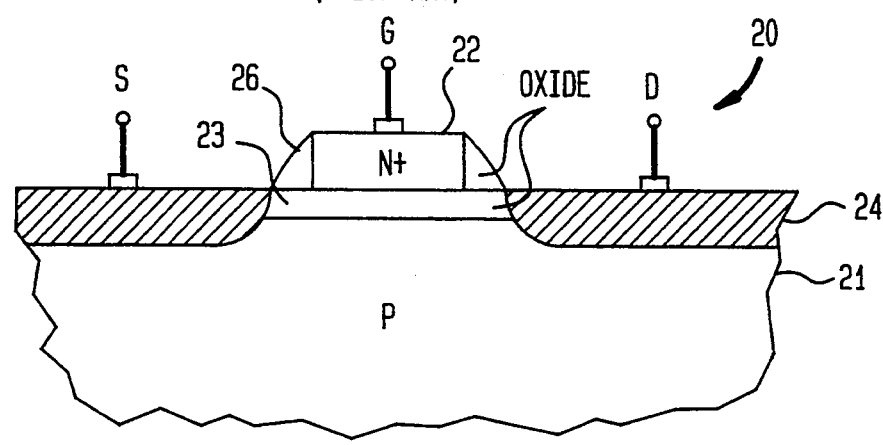
FIG. 2 is a cross-sectional view of a conventional Schottky barrier FET.

FIG. 2 shows a conventional Schottky barrier FET 20, again of the N-FET type; being formed on a P-type substrate or layer 21. The gate structure 22, including gate oxide 23 and sidewall oxide 26, is substantially similar to that of FIG. 1. However, rather than the source and drain structures being provided as a metal silicide region 15 and an oppositely doped semiconductor region 14, metal 24 such as tungsten is deposited in shallow trenches to extend beyond the depth of the gate oxide. In this case, a potential barrier is formed at the interface between metal 24 and the p-type material and extending for a distance within the p-type material. This barrier also tends to reduce leakage and to reduce series resistance in much the same manner as the junction in the conventional FET of FIG. 1. Conduction occurs in much the same way, as well. That is, the Schottky junction or diode is used to inject carriers into the channel in much the same manner as the junctions in the conventional FET of FIG. 1. The Schottky barrier at the source end is used to inject carriers into the channel. This is similar to conventional FET 10. The carriers are extracted at the drain side across a similar Schottky barrier which tends to reduce conduction compared to the conventional FET 10. In addition, the drain current for an ultra-short channel FETs having a channel length of less than 0.25 $\mu$m. becomes limited by the thermionic emission limit of the source Schottky diode, due to the smaller injection area.

Figure 3:
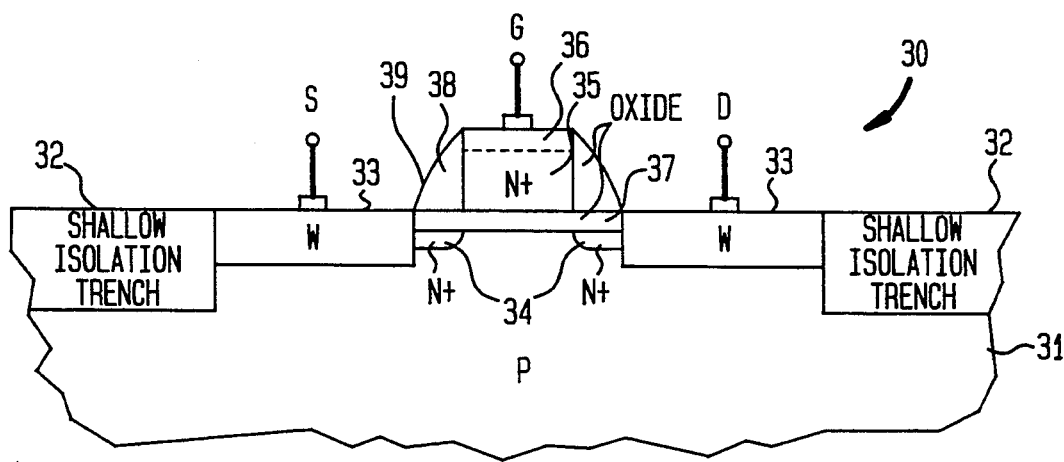
FIG. 3 is a cross-sectional view of a completed transistor in accordance with the invention.

The preferred structure of the ultra short channel FET is shown in FIG. 3. It is to be understood that all FIGURES are somewhat idealized and none are to scale. The illustration of the invention in FIGS. 3-9 is shown with similar gate lateral dimensions as the FETs of FIGS. 1 and 2 for clarity and to more readily contrast the novel structure of the present invention therewith. However, it is to be understood that the present invention, at low temperatures exhibits high performance even when fabricated with far smaller gate dimensions than the structures of FIGS. 1 and 2.

The FET 30 in accordance with the invention includes a substrate or layer 31 in which areas in which transistors are formed are separated by shallow isolation trenches 32 formed of an oxide or other insulative material. Metal source and drain deposits 33, preferably of tungsten, extend into the substrate or layer 31 for a distance beyond shallow junction structures 34, adjacent to the source and drain 33 and serving to connect the source and drain to the conduction channel of the FET which extends between them. Gate 35 of N+ polysilicon or polycide is insulated from the conduction channel by gate insulator 37, preferably formed of an oxide of the substrate material. Gate oxide 37 extends over the shallow junctions structure 34 between the metal source and drain deposits 33. Oxide gate sidewalls 38 cover the region between the gate edges and the edge of the metal source and drain deposits 33. The gate sidewalls 38 are also preferably covered with a thin (e.g. 40 nm) nitride spacer 39. Optionally, a cap of polycide or metal such as tungsten (particularly if polycide is used for the gate) can be provided on the gate.

While appearing superficially similar to the Schottky barrier FET of FIG. 2, the ultra-short channel FET 30 of the present invention is quite different since it includes both a shallow junction used both to control the channel thickness and as an injector for carriers and a Schottky barrier at both the source and drain to reduce the depletion region and control punch-through effects. The shallow junction structure 34, formed by low energy (e.g. 10–20 KeV for arsenic) N+ implants, are kept very shallow (e.g. 50 nm or less), which serves to reduce the depletion region and thus reduces punch-through effects. The use of a Schottky barrier for the bulk of the contact reduces the barrier energy across the depletion region. While reduction of the barrier height would also increase leakage when the transistor is operated at room temperature and when the transistor is fabricated with an ultra-short channel (e.g. under 0.25 $\mu$m), at reduced temperatures, leakage is greatly reduced since the electron energy is reduced below the height of the Schottky barrier. For example, at 77° K, leakage is reduced by several orders of magnitude (e.g. a factor of more than 1,000,000). The ultra-short channel reduces series resistance and no siliciding is required. Therefore there is no spreading resistance. Thus the combination of the shallow junction structure carrier injector and Schottky barriers to reduce the depletion region may be usefully exploited at low temperatures to form a high performance transistor. The shallow N+ junction at the source end removes the thermionic emission limitation on the drain current on the Schottky barrier FET. The shallow junction at the drain (high voltage) end removes the barrier to carrier extraction from the channel and, hence, reduces series resistance as compared to the Schottky barrier FET 20. Therefore, performance is comparable to or better than the conventional FET with much reduced short channel effect.

Referring now to FIGS. 4–8, the preferred fabrication methodology of the invention will now be discussed. In this regard, and while it is to be understood that the principles of the invention are applicable to larger transistors and non-cryogenic devices, the fabrication of ultra-short channel FETs imposes difficult registration tolerances on masking and patterning processes.

By way of introduction to this process, it is well-known in the art, that metals such as tungsten can be selectively deposited only on exposed semiconductor material but not on oxide surfaces. It will therefore be appreciated in the description of the fabrication process which follows that by maintaining a desired pattern of semiconductor and oxide over the areas in which transistors are to be formed in accordance with the invention, only a single patterning step requiring any degree of registration accuracy is required and, even in that step, registration tolerances are substantial. Only a small number of process steps are required and this may be further reduced in the completion of the transistor by combining the formation of the source and drain metal deposits with the well-known steps of formation of contact studs.

Figure 4:
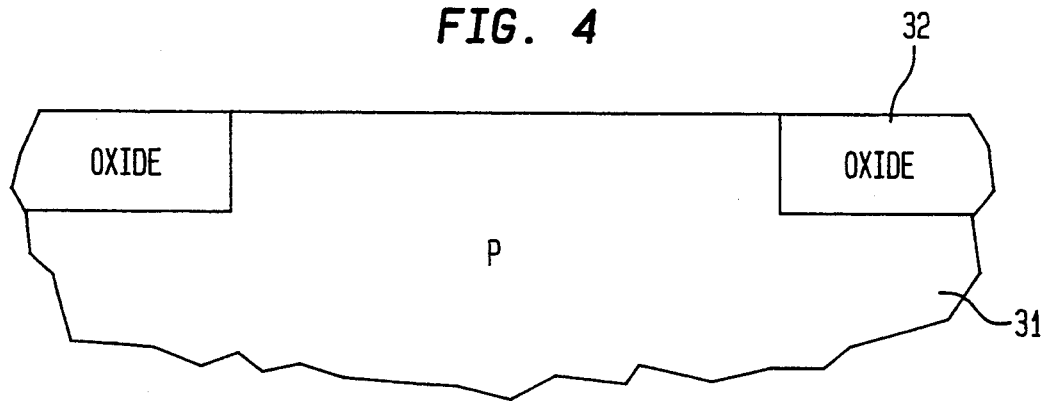
FIGS. 4, 5, 6, 7 and 8 illustrate stages of fabrication of the FET structure in accordance with the invention.

Beginning with FIG. 4, it will be assumed that the layer or substrate 31, which could also represent a well of opposite impurity type in a layer or substrate, has been prepared with shallow insulator (e.g. oxide) isolation trenches 32 which define the locations on the layer or substrate where the transistors are to be formed. The substrate or layer 31 could also have both P-type and N-type regions or wells for fabrication of CMOS integrated circuits. These shallow trenches are preferably separated by a distance of at least five times the channel length of the transistor design (e.g. 1.0–2.0 $\mu$m). This spacing is preferably based upon the registration tolerance which can be achieved at high yield with regard to gate location within this area. However, it is otherwise desirable to keep this spacing small for maximum integration density consistent with high manufacturing yield.

Figure 5:
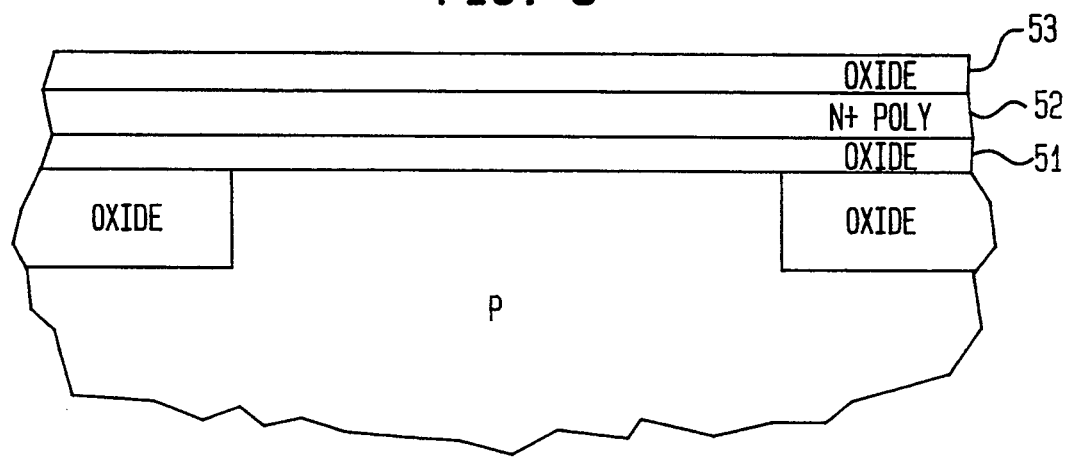

Then, as shown in FIG. 5, a blanket oxide layer 51 is formed over areas of the chip where transistors in accordance with the invention are to be formed. This is preferably done by heat treatment in an oxygen containing atmosphere in a manner well understood in the art. This oxide layer is followed by deposition of a gate electrode material layer 52 preferably of N+ polysilicon or a metal silicide followed by formation of a further oxide layer 53. It should be noted that these layers are all blanket layers and, at most, relatively low precision masking of areas not containing transistors in accordance with the invention is required. In addition, this polysilicon can be masked and doped P+ and N+ to form P-FETs and N-FETs. In practice, even this masking is seldom required since these three layers will be removed by etching (preferably reactive ion etching (RIE)) everywhere except where the gates are to be formed, as shown in FIG. 6 at bracket 61.

It should be noted that the formation of the gates at 61 is the only step of the process in accordance with the invention which requires patterning of layers of material. Registration of masks or other arrangements for achieving patterning need only be of sufficient accuracy to locate the gate area 61 at some point between the isolation trenches with enough space to form a source or drain metal deposit and a shallow junction on either side. Therefore registration tolerance is at least as great as the length of the gate.

It should also be noted that after the gate forming etch, the entire surface is comprised of either oxide or semiconductor (e.g. silicon, which is preferred although other semiconductor materials such as germanium could be used). Therefore, the low energy implantation of N type impurities to form shallow junction precursor structures 62, 62' in the semiconductor are essentially self masking. After this shallow ion implantation is done, gate insulator sidewalls 38 are formed. Alternatively, etching could first be done with patterning to leave oxide at 64 intact with implantation limited to areas 62 (since this implanted region will be later removed). Then impurities could be diffused into region 62' and the remainder of the sidewalls formed. However, this technique requires a greater number of steps and an additional patterning step and is therefore not preferred although considered to be within the scope of the present invention.

Figure 6:
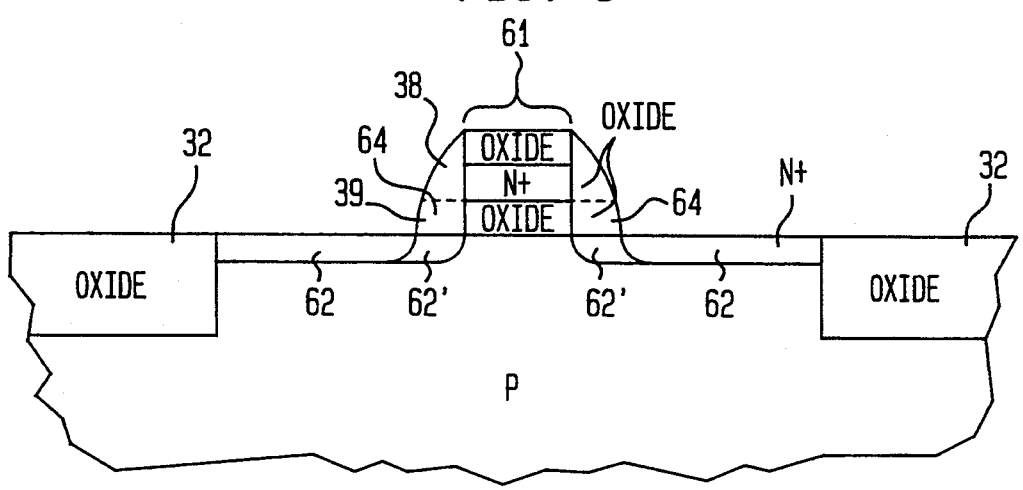
Figure 7:
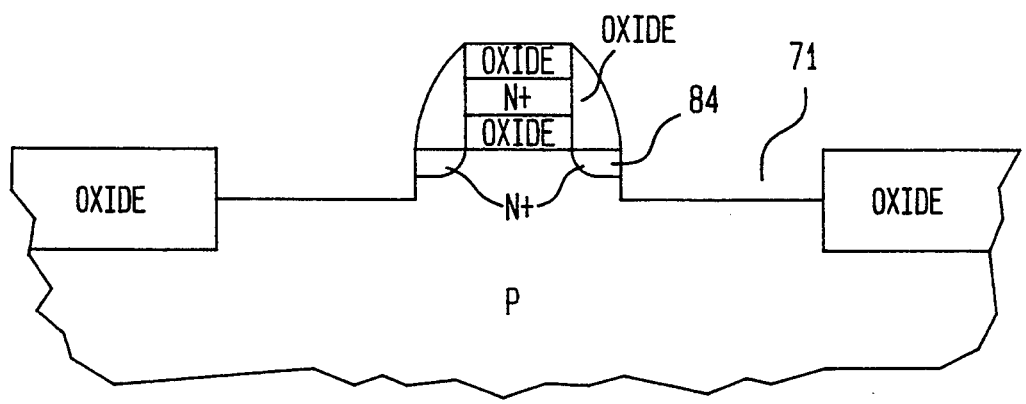
Figure 8:
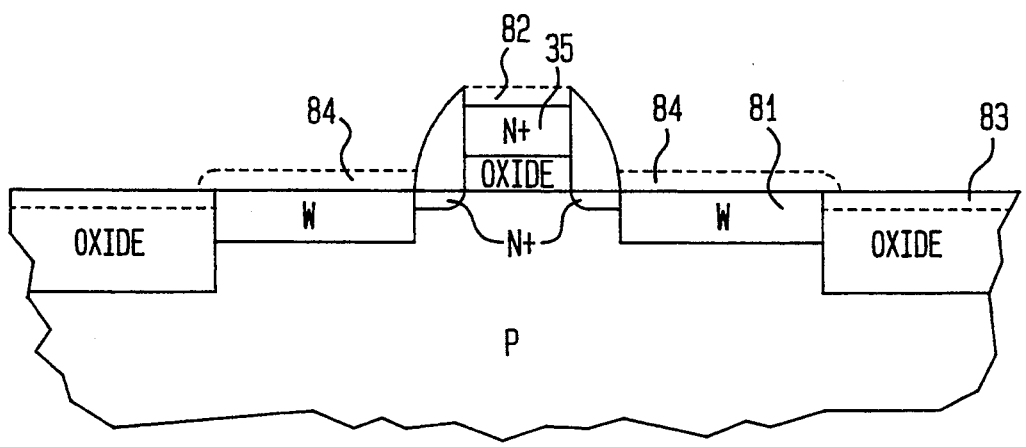

Note that the surface as shown in FIG. 6 remains either oxide or semiconductor. Thus, as shown in FIG. 7, by appropriate choice of etchants, preferably chlorine-containing dry etches, the semiconductor layer 31 can be selectively etched in a self masked manner to form trenches 71 to a depth of about 100 nm in order to complete formation of the shallow junction structures. Then, as shown in FIG. 8, metal 81 is selectively deposited on the semiconductor in the areas etched to form the source and drain contacts pads and to form the Schottky barrier below the shallow junctions. This metal deposition is followed by a gate opening etch step to remove the oxide at 82. Tungsten is preferred as a metal for deposits 81 since it serves well as an etch stop for this operation. Oxide will also be attacked by the etching process at 83 but etching in these areas does not affect the transistor or the isolation properties of the shallow isolation trenches. Then, a further selective deposit of polycide and/or tungsten is made in volume 82. This may also cause deposition of material at locations 84 over the metal deposit 81 but, again, this does not affect the operation or electrical characteristics of either the transistor or the shallow isolation trenches. Alternately, a gate cap can be formed by silicidation.

Figure 9:
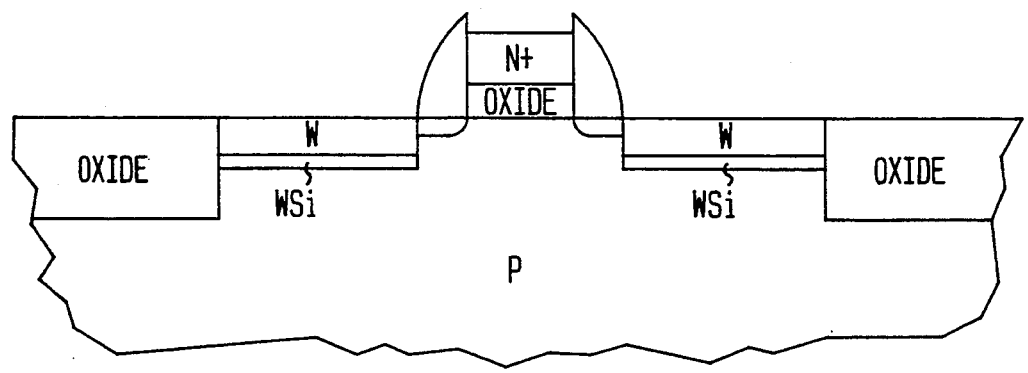
FIG. 9 shows an alternative to the fabrication step of FIGS. 7 and 8 in accordance with a variation of the invention.

Referring now to FIG. 9, an alternative variation of the invention is shown corresponding to the process at FIGS. 7 and 8. In this variation, selective formation of silicide rather than selective deposition of metal is carried out, preferably by silicidation and wet selective etching, to form a metal silicide at the bottom to trench 71. This is not necessary to the invention but may be preferable because of improved interface uniformity achieved thereby.

It is also to be understood that the foregoing method of forming the FET in accordance with the invention is also applicable to the formation of P-FETs simply by reversing the impurity types indicated. Also for the N-FET or the P-FET, an additional angled implant on either side of the gate can be done to reduce punch through effects. Formation of transistors of both N-FET and P-FET types can be formed together on the same substrate for CMOS integrated circuits and many steps may be done simultaneously for both types of transistor without increasing registration tolerances.

In view of the foregoing, it is seen that the transistor and method of its fabrication in accordance with the invention provides a high performance transistor suitable for extremely high integration density and of reduced fabrication complexity. The series resistance of the FET in accordance with the invention is reduced while substantially avoiding short channel effects.

While the invention has been described in terms of a single preferred embodiment, those skilled in the art will recognize that the invention can be practiced with modification within the spirit and scope of the appended claims.

Having thus described by invention, what I claim as new and desire to secure by Letters Patent is as follows:

1. A method of fabricating a field effect transistor including the steps of forming blanket layers of a gate oxide, a gate electrode material and an oxide overlying said layer of gate electrode material, over a layer of semiconductor material of a first conductivity type having shallow isolation trenches formed therein, patterning said blanket layers to remove said blanket layers except at a generally centered location between a pair of said shallow isolation trenches, remaining portions of said blanket layers being laterally separated from edges of said shallow isolation trenches, implanting an impurity of a second conductivity type to a first depth between edges of said remaining portions of said blanket layers and said shallow trenches, forming sidewall spacers on said remaining portions of said blanket layers, removing material from a surface of said layer of semiconductor material to a second depth, said second depth exceeding said first depth, between edges of said shallow trenches of said sidewall spacers, and depositing metal in volumes formed by said removing step.

2. A method as recited in claim 1, including the further steps of removing said oxide overlying said layer of gate electrode material, and depositing a layer of material of said gate electrode material.

3. A method as recited in claim 1, wherein said step of forming sidewall spacers includes forming a layer of oxide.

4. A method as recited in claim 1, wherein said step of forming sidewall spacers includes forming a layer of nitride.

5. A method as recited in claim 1, wherein said step of depositing metal includes selective deposition of metal on semiconductor material surfaces.

6. A method as recited in claim 1, wherein said first depth of said implanting step is less than 50 nm.

7. A method as recited in claim 6 wherein said second depth is 100 nm.

8. A method as recited in claim 1, wherein said step of depositing metal includes the step of forming a metal silicide.

* * * * *

UNITED STATES PATENT AND TRADEMARK OFFICE
CERTIFICATE OF CORRECTION

PATENT NO. : 5,338,698
DATED : August 16, 1994
INVENTOR(S) : Seshadri Subbanna

It is certified that error appears in the above-identified patent and that said Letters Patent is hereby corrected as shown below:

In column 8, line 35: change "of" (after the word trenches) to --and--.

In column 8, line 43: change "of said gate" to --on said gate--.

Signed and Sealed this

First Day of November, 1994

BRUCE LEHMAN

Attest:

Attesting Officer

Commissioner of Patents and Trademarks